(12) United States Patent
Klapper

(10) Patent No.: US 9,140,756 B2
(45) Date of Patent: Sep. 22, 2015

(54) MEASURING DEVICE FOR CHECKING AN ELECTRICAL CIRCUIT BREAKER

(71) Applicant: Omicron Electronics GmbH, Klaus (AT)

(72) Inventor: Ulrich Klapper, Rankweil (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 217 days.

(21) Appl. No.: 13/865,471

(22) Filed: Apr. 18, 2013

(65) Prior Publication Data

US 2013/0300423 A1  Nov. 14, 2013

(30) Foreign Application Priority Data

May 10, 2012 (EP) ..................................... 12003725

(51) Int. Cl.
  *G01R 31/327* (2006.01)
  *G01R 27/20* (2006.01)
  *G01R 31/333* (2006.01)

(52) U.S. Cl.
  CPC .......... *G01R 31/3274* (2013.01); *G01R 27/205* (2013.01); *G01R 31/3272* (2013.01); *G01R 31/3277* (2013.01); *G01R 31/333* (2013.01)

(58) Field of Classification Search
  CPC ............... G01R 27/205; G01R 31/327; G01R 31/3272; G01R 31/3274; G01R 31/3277; G01R 31/333; G01R 31/3336
  USPC .............................. 324/415–418, 424; 361/42
  See application file for complete search history.

(56) References Cited

U.S. PATENT DOCUMENTS

| 5,117,189 | A * | 5/1992 | Terminiello et al. ........... 324/415 |
| 5,388,467 | A * | 2/1995 | Jereb et al. ............... 73/862.381 |
| 6,857,090 | B2 * | 2/2005 | Lee et al. ...................... 714/724 |
| 7,428,132 | B1 * | 9/2008 | Radosavljevic et al. ........ 361/42 |

(Continued)

FOREIGN PATENT DOCUMENTS

| EP | 2 163 911 | 3/2010 |
| EP | 2163911 | 3/2010 |

(Continued)

OTHER PUBLICATIONS

Apostolov, A. et al; Testing Requirements for IEC 61850 Based Devices (believed to be 2000).

(Continued)

*Primary Examiner* — Hoai-An D Nguyen
(74) *Attorney, Agent, or Firm* — Workman Nydegger

(57) ABSTRACT

Measuring device for checking an electrical circuit breaker includes a current generating unit designed to generate a measurement current for a continuity measurement of a switching contact of the circuit breaker. The measuring device furthermore includes a measuring unit for registering a measurement signal at the circuit breaker, an energy supply unit for supplying a control drive of the circuit breaker with electrical energy, and a control unit, which has a timer. The control unit is able output to the control drive, via the control output, a signal for opening or closing the circuit breaker, and to determine a time-based switching behavior of the circuit breaker in dependence on the measurement signal. Further, the control unit is designed, in the case of the circuit breaker being closed, to determine the resistance of the switching contact in dependence on the measurement current and the measurement signal.

16 Claims, 2 Drawing Sheets

(56) References Cited

U.S. PATENT DOCUMENTS

| | | | |
|---|---|---|---|
| 8,280,670 B2* | 10/2012 | Williams | 702/115 |
| 8,299,799 B2* | 10/2012 | Finlay et al. | 324/424 |
| 2003/0090271 A1 | 5/2003 | Hurwicz | |
| 2011/0084715 A1* | 4/2011 | Stanisic et al. | 324/713 |

FOREIGN PATENT DOCUMENTS

| | | |
|---|---|---|
| JP | 5235908 B2 | 7/2013 |
| JP | 2013176278 A1 | 9/2013 |
| KR | 101134391 B1 | 4/2012 |
| WO | 2009/131530 | 10/2009 |
| WO | WO2009/131530 | 10/2009 |

OTHER PUBLICATIONS

Atienza, E; *Schweitzer Engineering Laboratories, Inc.*, Testing and Troubleshooting IEC 61850 GOOSE-Based Control and Protection Schemes (2000 IEEE).

Apostolov et al., "Testing requirements for IEC 61850 based devices", Power Systems Conference: Advanced Metering, Protection, Control, Communication, and Distributed Resources, 2007.

European Search Report dated Nov. 5, 2012 for EP Application No. 12003725.4.

* cited by examiner

MEASURING DEVICE FOR CHECKING AN ELECTRICAL CIRCUIT BREAKER

This application claims the benefit of European Patent Application No. EP 12 003 725.4, filed May 10, 2012, the disclosure of which is incorporated herein in its entirety.

BACKGROUND

The present invention relates to measuring devices for checking an electrical circuit breaker, in particular for checking electric circuit breakers in electrical power generation and transmission plants following commissioning or service inspection of the circuit breaker.

Circuit breakers, which are also referred to as high-voltage switches, are special switches designed for high currents. In energy engineering plants such as, for example, power generation plants such as power stations or power transmission plants, circuit breakers switch not only operating currents, but also overload currents or short-circuit currents in the case of faults. Circuit breakers can be used both to switch on these currents and to switch off the currents. A circuit breaker usually comprises a switching contact and a control drive that mechanically drives the switching contact. The control drive can comprises, for example, spring drives or compressed-air drives, which store mechanical energy that is used for rapid switching of the switching contact. The spring drives or compressed-air drives can be biased or "charged", for example, by means of electrical drives. The release of the stored mechanical energy for switching the switching contact can be effected by means of so-called trip coils, which are operated electrically. In the electrical plants there is usually a station battery, which provides a direct-current voltage (DC voltage) of between 48 and 200 V, in order to supply the trip coils with energy. Only a floating relay contact is then required for opening or closing. During operation, the commands for opening or closing usually come from protective relays or the instrumentation and control system.

During the checking of an electrical circuit breaker, a so-called micro-ohm test is usually performed, in which, with the switching contact closed, the resistance occurring at the circuit breaker is measured by means of infeed of a predefined current. The predefined current can be of several hundred amperes, for example 200 A. Furthermore, during the checking of the electrical circuit breaker, a so-called timing test can be performed, which registers a switching duration that is required by the switch in order to execute the switching function command after a control command has been applied. Furthermore, a so-called loss-factor test or tan delta test can be performed if the circuit breaker is located in an earth housing, a so-called tank. The loss-factor test is also referred to as a "dead tank test".

In order to perform the timing test, control commands must be issued, in order to open and close the switch. For this, the trip coils require a certain amount of energy. According to the prior art, this energy comes either from the station battery or from a further device that provides the required DC voltage during testing. Tests are also performed in which the DC voltage is reduced below the nominal value, in order to check whether the switch also works faultlessly with reduced voltage. This test is also referred to as an undervoltage test. This required energy source is referred to in the following as an energy supply unit. The energy supply unit can also be used to recharge the energy storage device in the control drive of the switch. This is effected through application of an alternating current voltage (AC voltage) or DC voltage, usually in the range of from 48 V DC to 230 V AC nominal.

Usually, in order to perform the tests described above, various devices are used, which are connected in succession to the circuit breaker for the purpose of performing the corresponding tests, it also being possible for the energy supply unit to be used at the same time in the case of some tests.

SUMMARY

It is therefore the object of the present invention to provide a measuring device by means of which an electrical circuit breaker can be checked reliably and more efficiently than in the prior art. This object is achieved, according to the present invention, by a measuring device for checking an electrical circuit breaker, according to claim 1, and by a measuring device for checking an electrical circuit breaker, according to claim 12. The dependent claims define preferred and advantageous embodiments of the invention.

Provided according to the present invention is a device for checking an electrical circuit breaker, which device comprises a current generating unit, a measuring unit, an energy supply unit, a control output and a control unit. The current generating unit is designed to generate a measurement current for a continuity measurement of a switching contact of the circuit breaker, and can be coupled to the circuit breaker for the purpose of feeding the measurement current into the circuit breaker. In the context of this description, the continuity measurement denotes a measurement that indicates, at least, whether the switching contact of the circuit breaker is contacted through or not. This can be determined, for example, in that a voltage drop across the switching contact is determined by means of the measuring unit described in the following. If the voltage drop is below a predefined value, it is determined that the switching contact is connected through. Otherwise, it is determined that the switching contact is open. Alternatively, it is also possible to determine the measurement current flowing through the circuit breaker, and to determine the switching contact as closed as soon as a predetermined magnitude of current is exceeded. As an alternative to this, it can also be attempted to drive a current across the contact. If this is possible, the switch is closed; if not, the switch is open. The measuring unit can be coupled to the circuit breaker and is able to register a measurement signal at the circuit breaker. The measurement signal can comprise, in particular, a voltage drop across the switching contact of the circuit breaker.

The energy supply unit is designed to supply a control drive of the circuit breaker with electrical energy, which control drive either opens or closes the switching contact of the circuit breaker. As has already been explained above, the control drive of the circuit breaker can comprise an energy storage device for actuating the switching contact, such as, for example, a spring drive or a gas drive. The control drive can further comprise a motor for loading the spring or compressing the gas, i.e. for "charging" the energy storage device. The energy supply unit therefore, for example, supplies this motor with electrical energy. Alternatively, the control drive of the circuit breaker can also comprise, for example, a capacitor, which stores electrical energy in order to provide sufficient energy to electromechanically open or close the switching contact of the circuit breaker. In this case, the energy supply unit is able to supply this capacitor with electrical energy.

The control output can be coupled to the control drive of the circuit breaker, and is designed to output signals for opening and/or closing the circuit breaker. The circuit breaker can have, for example, trip elements or trip coils, activated with a direct-current voltage of, for example, 200 V, in order to initiate the opening or closing of the switching contact of the circuit breaker. The control output provides corresponding control voltages. Alternatively, the control drive can be activated through a command or a control message, according to the standard IEC 61850, for opening or closing the circuit breaker. In this case, the control output provides corresponding control messages according to IEC 61850. The measuring device can thereby directly activate the circuit breaker without additional components, and consequently the process of checking the circuit breaker can be simplified.

The control unit comprises a timer, to enable time sequences to be recorded with precision. The control unit is designed to output a signal, via the control output, for opening or closing the circuit breaker, and to determine a time-based switching behaviour of the circuit breaker in dependence on the measurement signal. For example, by means of the timer, the control unit can measure the time that elapses between the outputting of the signal for opening or closing the circuit breaker and the actual opening or closing of the circuit breaker. If the circuit breaker is closed, the control unit is additionally able to determine the resistance of the switching contact in dependence on the measurement current and the measurement signal.

The measuring device can comprise a housing, in the form of a portable unit, in which at least the current generating unit, the measuring unit, the energy supply unit, the control output and the control unit are accommodated. Consequently, both a timing test and a micro-ohm test of the circuit breaker can be performed by means of one measuring device. In this case, components such as, for example, the current generating unit and the measuring unit are used jointly, such that cost savings can be made for the measuring device. Moreover, after the measuring device has been connected to the circuit breaker, both measurements or tests can be performed, without the necessity of recabling. Consequently, checking of the electrical circuit breaker can be performed more efficiently. Since the measuring device additionally comprises the energy supply unit for the control drive, testing of the circuit breaker can be performed irrespective of whether or not there is a corresponding energy supply unit available in situ for the control drive of the circuit breaker. If a corresponding energy supply is available in situ, for example a station battery or a corresponding current connection, this energy supply can be used and therefore likewise checked in respect of its functional capability.

As described above, the circuit breaker can comprise a motor for loading a spring or for compressing a gas, or can comprise a chargeable capacitor. It is thereby possible to constitute an energy supply unit that delivers the actual energy for actuating the switching contact. By means of trip coils, for example, during the actual switching operation a command is issued to the switch to effect switching, and the energy of the energy storage device is used to actuate the switching contact. The energy storage device is then recharged. According to one embodiment, the energy supply unit provides the energy for the energy storage device. Furthermore, the measuring device can be designed to provide an electrical power for controlling the trip devices via the control output, as a result of which signals for opening and/or closing the circuit breaker can be supplied to the trip devices of the control drive of the circuit breaker. Since the measuring device provides the energy for charging the energy storage device of the control drive of the circuit breaker and for operating the trip devices, the circuit breaker can be operated and checked, by means of the measuring device, without additional energy supply systems.

According to one embodiment, the measuring unit is designed to register a measurement signal course. The control unit is able to determine a resistance course of the switching contact, for example during a closing or opening operation, in dependence on the measurement current and the measurement signal course. It is therefore possible to determine and check, not only the contact resistance of the switching contact in the closed state, but also a change in the resistance of the switching contact during the opening or closing of the switching contact. This information can be used, for example, as a basis for checking a state of wear and correct functional capability of the switching contact.

In the case of a further embodiment, the measuring device comprises a high-voltage generating unit, which is designed to generate a high voltage for a loss-factor measurement. Furthermore, the measuring device can comprise a loss-factor measuring device, which is designed to determine a loss factor of the circuit breaker in dependence on the high voltage. The loss-factor measuring device can comprise, for example, a loss-factor measuring bridge, by means of which the high voltage, for example up to 12 kV, is supplied to a test connection of a capacitive leadthrough of an earthed housing, in which the circuit breaker is disposed. The loss-factor measuring device checks, for example, the extent to which the capacitance of the capacitive leadthrough deviates from an ideal or required capacitance. Such a deviation is also referred to as a power factor, dissipation factor or tan delta. This information is useful for evaluating the state of the leadthrough. Circuit breakers in an earthed housing are also referred to as dead tank circuit breakers. The combination of the circuit breaker test with the loss-factor measurement enables a total unit, composed of a circuit breaker and an earthed housing, to be checked in a simple and efficient manner.

In particular, the measuring device can comprise a housing, in the form of a portable unit, in which the current generating unit, measuring unit, energy supply unit and control output and are accommodated. Further, the energy supply unit can also be used to supply the high-voltage generating unit and the loss-factor measuring device. As a result, circuit breakers accommodated in an earthed housing can be checked by means of only one measuring system. Moreover, the use of the current generating unit to supply the switch during testing and to supply the high-voltage generating unit, in a common housing, enables components such as, for example, a switched-mode power supply, but primarily also a power amplifier, to be used jointly, thereby enabling the cost, weight and volume of the measuring device to be reduced.

Additionally provided according to the present invention is a measuring device for checking an electrical circuit breaker, which device comprises a current generating unit, a measuring unit, a control output and a control unit having a timer. The current generating unit is designed to generate a measurement current for a continuity measurement of a switching contact of the circuit breaker, and can be coupled to the circuit breaker for the purpose of feeding the measurement current into the circuit breaker. The measuring unit can be coupled to the circuit breaker and is able to register a measurement signal at the circuit breaker, for example a voltage drop across the switching contact of the circuit breaker. Signals for opening and/or closing the circuit breaker can be output via the control output. For this purpose, the control output can be coupled to a control drive of the circuit breaker. The control unit is able to output a signal, via the control output, for opening or closing the circuit breaker, and, by means of the timer, to determine a time-based switching behaviour of the circuit breaker in dependence on the measurement signal. The signal output by the control unit, via the control output, for opening or closing the circuit breaker comprises a control message according to the standard IEC 61850. The standard IEC 61850 describes buses and protocols used in energy engineering plants such as, for example, transformer plants, for the purpose of transmitting commands, for example so-called goose messages, or carrying data or data streams (IEC 61850-9-2). Goose commands can be used, for example, to transmit commands for opening or closing circuit breakers. During testing or checking of a circuit breaker, therefore, the measuring device is itself able to generate these commands for opening or closing the circuit breaker, such that no additional components are required for testing the circuit breaker.

According to one embodiment, the control unit is additionally designed to receive a signal from an auxiliary contact of the circuit breaker. The signal from the auxiliary contact indicates a progress of the opening or closing of the circuit breaker. The control unit is able, in dependence on the measurement signal and the signal from the auxiliary contact, to determine the time-based switching behaviour of the circuit breaker. The signal from the auxiliary contact of the circuit breaker can be transmitted by means of a message, according to the standard IEC 61850, from the circuit breaker to the control unit, or requested from the circuit breaker by the control unit. By means of the information relating to the switching progress, the time-based switching behaviour of the circuit breaker can be registered in detail and checked.

Although the special features described in the above summary have been described in combination with special embodiments, it is clear that the features of the described embodiments can be combined with each other in any manner.

BRIEF DESCRIPTION OF THE DRAWINGS

The present invention is explained in detail in the following with reference to the drawing.

DETAILED DESCRIPTION

Figure 1:
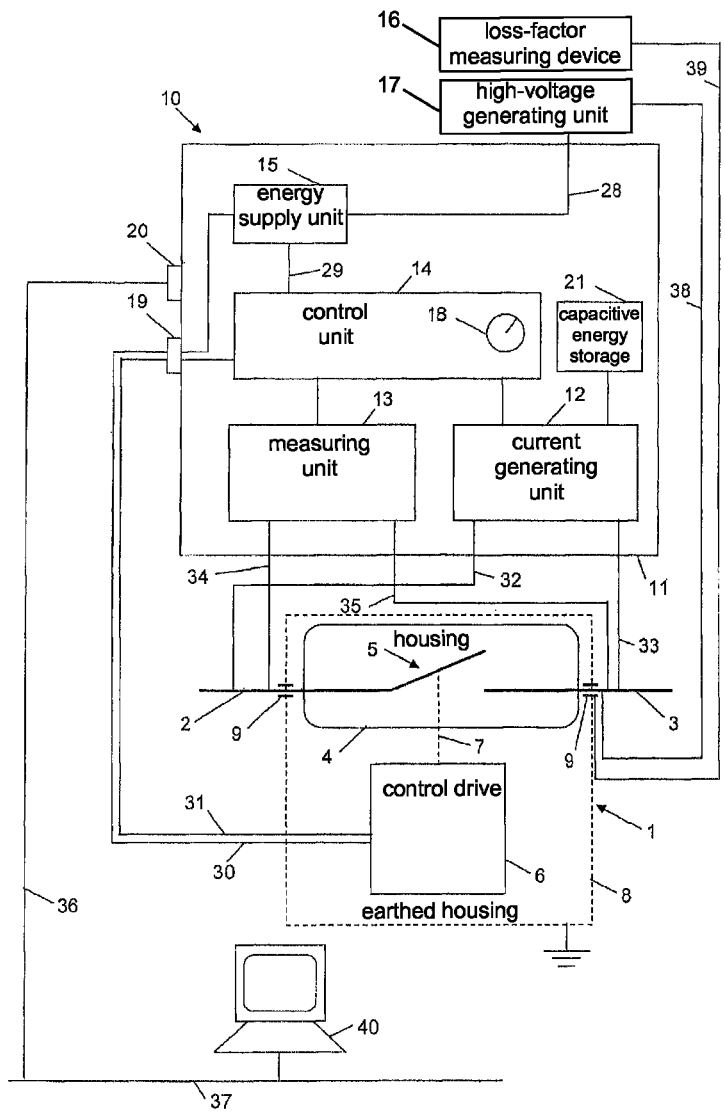
FIG. 1 shows a measuring device according to one embodiment of the present invention in combination with a circuit breaker.

In the following description of differing embodiments, direct connections or couplings, between functional blocks, devices, components or physical or functional units, that are shown in the figures or described herein, can also be realized by means of an indirect connection or coupling. Reference numerals that are the same in the differing figures denote components that are similar or identical. Furthermore, it is clear that the features of the differing exemplary embodiments described herein can be combined with each other in any manner.

FIG. 1 shows a circuit breaker 1, a measuring device 10 and an evaluation device 40, a so-called main unit or a so-called ground station. The circuit breaker 1 comprises a switching contact 5, which either makes or breaks an electrical connection between two lines 2, 3, for example high-voltage lines. The switching contact 5 is disposed in a housing 4. The circuit breaker 1 additionally comprises a control drive 6, which activates the switching contact 5 mechanically, via a mechanical coupling 7. The control drive 6 can comprise mechanical or electrical energy storage devices, which can be activated via trip elements and which provide the mechanical energy for opening or closing the switching contact 5 via the mechanical coupling 7. The energy storage device of the control drive 6 can comprise, for example, springs that can be biased by means of an electric motor and that can be tripped by means of trip coils in such a way that, as they are released, they transmit mechanical energy, via the mechanical coupling 7, to the switching contact 5. Alternatively, the energy storage device can comprise a gas drive, in which gas is compressed and can be expanded by means of a trip mechanism. Through the expansion of the gas, the mechanical drive 7 can be driven for the purpose of activating the switching contact 5. Furthermore, the control drive 6 can comprise an electrical energy storage device, which is charged with a predefined amount of energy, in order to give off this amount of energy, in a short period of time, via an electromechanical converter, for the purpose of activating the switching contact 5. For the purpose of charging the energy storage device of the control drive 6, electrical energy is supplied to the control drive 6 via a line 30, for example at an alternating-current voltage of 230 V. For the purpose of activating the trip elements of the control drive 6, i.e. in order to activate an operation for opening or closing the switching contact 5, a control signal is supplied to the control drive 6 by a control unit 14 of the measuring device 10, via a line 31. The control unit 14 obtains the necessary energy from an energy supply unit 15 of the measuring device 10, via a line 29. The control signal can be, for example, a direct-current voltage signal having, for example, a voltage of 200 V, as a result of which the trip elements of the control drive 6 can be tripped. Alternatively, the line 31 can comprise a digital data bus connection, via which the control signal for tripping the trip elements of the control drive 6 is transmitted in the form of digital telegrams, so-called goose commands, for example according to the standard IEC 61850.

The switching contact 5 of the circuit breaker 1 can be disposed, for example, at a predefined height, for example at a height of 6 m, on an insulated mount and connected to the lines 2, 3. Alternatively, the circuit breaker 1 can comprise an earthed housing 8, which has insulated leadthroughs 9, through which the lines 2, 3 to the switching contact 5 are routed.

The measuring device 10 comprises a housing 11, in which a current generating unit 12, a measuring unit 14, the control unit 14 and the energy supply unit 15 are disposed. The current generating unit 12 is designed to generate a measurement current for a continuity measurement of the switching contact 5 of the circuit breaker 1, and is able to provide a measurement current of preferably a hundred amperes or more. To enable a measurement current to be provided briefly at high energy, the measuring device 10 can further comprise a capacitive energy storage device 21, which is coupled to the current generating unit 12 in order to briefly provide more energy to the current generating unit 12 than is available via an energy supply connection 20 of the measuring device 10. The current generating unit 12 is coupled to the circuit breaker 1 via connections 32, 33 in such a way that a measurement current can be routed from the current generating unit 12 via the switching contact 5 of the circuit breaker 1. The measuring unit 13 is connected to the circuit breaker 1 via connections 34, 35 in such a way that the measuring unit 13 can register a measurement signal at the circuit breaker 1, for example a voltage drop across the switching contact 5.

The control unit 14 is connected to the current generating unit 12 and to the measuring unit 13 and, via a control output 19 and the connection 31, to the circuit breaker 1. Furthermore, the control unit 14 comprises a timer 18, to enable operations to be controlled and recorded with time precision. The control unit 14 is therefore suitable for performing a so-called timing test and a so-called dynamic resistance measurement of the circuit breaker 1. The control unit 14 in this case activates the circuit breaker to open or close the switching contact 5. By means of the signals from the measuring unit 13, the control unit 14 determines the time-based switching behaviour of the circuit breaker 1, for example a period of time between output of a command to open the switching contact 5 and the instant at which the connection is actually broken by means of the switching contact 5. In addition, the control unit 14 can receive signals from auxiliary contacts of the circuit breaker 1 via, for example, the connection 31, in order to determine and record additional information relating to the time-based course of the switching behaviour of the circuit breaker 1. The information, determined by the control unit 14, in respect of the switching behaviour of the circuit breaker 1 can be transmitted, for example, to the evaluation device 40. The transmission can be effected, for example, via a special data transmission cable, in digital form or, for example, as digital data, via an energy supply cable 36, which couples the measuring device 10 to an energy supply network 37, to which the evaluation device 40 is also coupled. Methods for transmitting digital information via energy supply lines are known in the prior art, for example known by the terms Power over Ethernet or Power Line Communication.

If the circuit breaker 1 is disposed in an earthed housing 8, as described above, with the high-voltage lines 2, 3 being routed into the interior of the earthed housing 8 via leadthroughs 9, a loss-factor measurement can be performed, by means of the measuring device 10 and a loss-factor measuring device 16 and a high-voltage generating unit 17, in order to evaluate the state of the leadthroughs 9. For this purpose, a voltage is generated in the energy supply unit 15 and converted, by means of the high-voltage generating unit 17, into a high voltage of several kilovolts, for example in the range of 2 to 12 kV, and routed to the leadthrough 9 via a connection 38. By means of, for example, a loss-factor measuring bridge in the loss-factor measuring device 16, it can be checked, at a test connection of the leadthrough 9, by means of the line 39, how close the capacitance of the capacitive leadthrough 9 comes to an ideal capacitance, in order that the state of the leadthrough 9 can be determined therefrom.

If the switching contact 5 of the circuit breaker 1 is closed, the resistance of the switching contact can be determined from the measurement current provided by the current generating unit 12 and from the voltage drop across the switching contact 5 determined by the measuring unit 13. This is the so-called micro-ohm measurement. Thus, for example, a state of wear of the switching contact 5 and a functional capability of the circuit breaker 1 can be performed in one step by means of the measuring device 10, without additional recabling.

In summary, a comprehensive test of the circuit breaker 1 can be performed by means of the measuring device 10, this test comprising, in particular, a timing test, a micro-ohm test and a loss-factor test. Since the measuring device 10 provides all signals required for the testing and activation of the circuit breaker 1, in particular the measurement current, control signals, supply voltages and the high voltage, no additional components are required for checking the circuit breaker 1.

Figure 2:
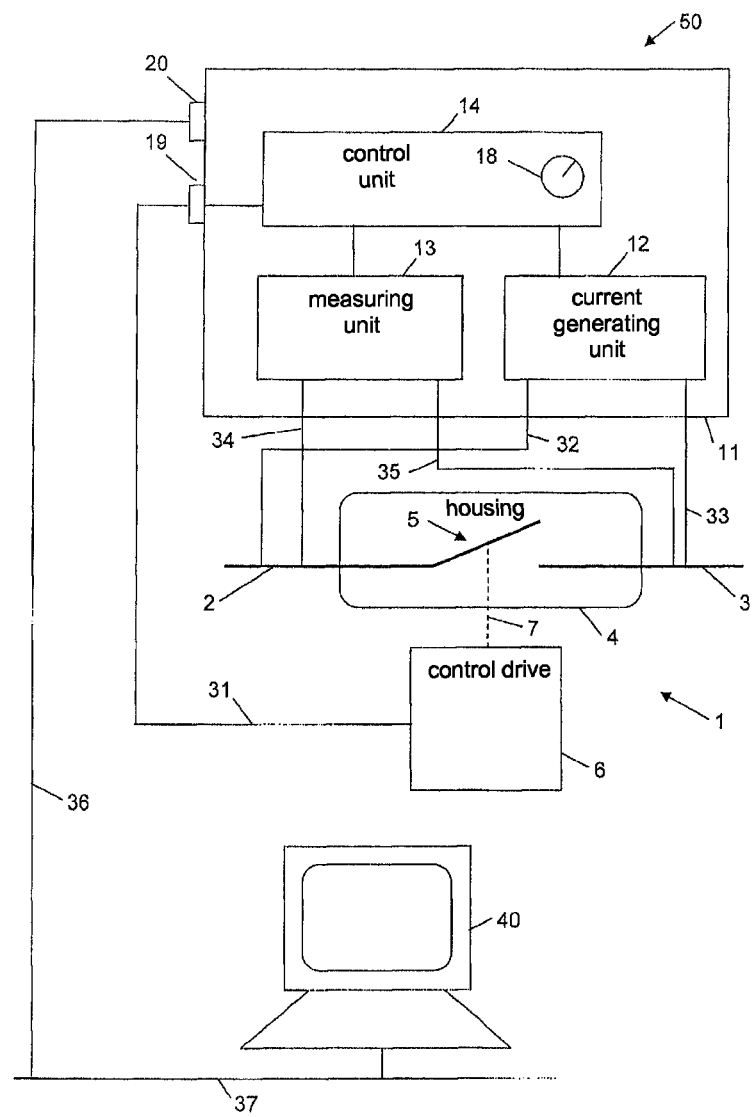
FIG. 2 shows a further embodiment of a measuring device according to the present invention.

FIG. 2 shows a measuring device 50, which comprises the previously described current generating unit 12, the measuring unit 13, the control output 19, and the control unit 14 comprising the timer 18. The current generating unit 12 and the measuring unit 13 correspond to the corresponding components of FIG. 1, and are therefore not described again in detail here. The control unit 14 is able to output a signal, via the control output 19, for opening or closing the circuit breaker 1, and to determine a time-based switching behaviour of the circuit breaker in dependence on the measurement signal of the measuring device 13. The signal that is output by the control unit, via the control output 19, for opening or closing the circuit breaker is a control message according to the standard IEC 61850. The control unit can additionally be able to receive a signal from an auxiliary contact of the circuit breaker 1, which signal indicates a progress of the opening or closing of the circuit breaker 1 and is likewise transmitted, by means of a message according to the standard IEC 61850, from the circuit breaker 1 to the control unit 14. Since the measuring device 50 is directly suitable for sending and receiving commands and messages according to the standard IEC 61850, circuit breakers that are controlled in accordance with the standard IEC 61850 can be activated and checked directly by the measuring device 50, without additional components.

The invention claimed is:

1. A measuring device for checking an electrical circuit breaker, the measuring device comprising:
    a current generating unit configured to generate a measurement current for a continuity measurement of a switching contact of the circuit breaker,
    a measuring unit coupled to the circuit breaker and configured to detect a measurement signal at the circuit breaker,
    an energy supply unit configured to supply a control drive with electrical energy for the purpose of opening or closing the circuit breaker,
    a control output coupled to the control drive of the circuit breaker and which is configured to output signals to open and/or close the circuit breaker, and
    a control unit, which has a timer and which is configured to output, via the control output, a signal to open or close the circuit breaker, and
    to determine a time-based switching behaviour of the circuit breaker in dependence on the measurement signal and,
    in the case of the circuit breaker being closed, to determine the resistance of the switching contact in dependence on the measurement current and the measurement signal.

2. The measuring device according to claim 1, the measuring device comprising a housing, in the form of a portable unit, in which at least the current generating unit, the measuring unit, the energy supply unit, the control output and the control unit are accommodated.

3. The measuring device according to claim 1, the control drive of the circuit breaker comprising trip devices, to which signals for opening and/or closing the circuit breaker are supplied, the measuring device being configured to provide an electrical power for activating the trip devices via the control output.

4. The measuring device according to claim 1, the control drive comprising an energy storage device configured to actuate the switching contact, the energy supply unit being configured to provide energy for the energy storage device.

5. The measuring device according to claim 1, the measuring unit being configured to detect a measurement signal course, and the control unit being configured to determine a resistance course of the switching contact in dependence on the measurement current and the measurement signal course.

6. The measuring device according to claim 1, further comprising a high-voltage generating unit, which is supplied by the energy supply unit and which is configured to generate a high voltage for a loss-factor measurement of a circuit breaker disposed in an earthed housing.

7. The measuring device according to claim 6, further comprising:
    a loss-factor measuring device configured to determine a loss factor of the circuit breaker, disposed in an earthed housing, in dependence on the high voltage.

8. The measuring device according to claim 7, the measuring device comprising a housing, in the form of a portable unit, in which at least the current generating unit, the measuring unit, the energy supply unit, the control output and the control unit are accommodated, and comprising a high-voltage generating unit, which is supplied by the energy supply unit, and comprising a loss-factor measuring device.

9. The measuring device according to claim 1, the current generating unit being configured to generate a measurement current of at least 100 A.

10. The measuring device according to claim 1, the measurement signal comprising a voltage across the switching contact of the circuit breaker.

11. The measuring device according to claim 1, wherein the signal that is output by the control unit, via the control output, to open or close the circuit breaker includes a control message according to IEC 61850.

12. The measuring device according to claim 1, the control unit being configured
  to receive a signal from an auxiliary contact of the circuit breaker, which signal indicates a progress of the opening or closing of the circuit breaker, and
  to determine the time-based switching behaviour of the circuit breaker in dependence on the measurement signal and the signal from the auxiliary contact.

13. The measuring device according to claim 12, the control unit being configured to receive the signal from the auxiliary contact of the circuit breaker by a message according to IEC 61850.

14. A measuring device for checking an electrical circuit breaker, the measuring device comprising:
  a current generating unit configured to generate a measurement current for a continuity measurement of a switching contact of the circuit breaker and which can be coupled to the circuit breaker for the purpose of feeding the measurement current into the circuit breaker,
  a measuring unit coupled to the circuit breaker and which is configured to detect a measurement signal at the circuit breaker,
  a control output coupled to the control drive of the circuit breaker and which is configured to output signals to open or close the circuit breaker, and
  a control unit, which has a timer and which is configured
  to output, via the control output, a signal to open or close the circuit breaker, and
  to determine a time-based switching behaviour of the circuit breaker in dependence on the measurement signal,
  wherein the signal that is output by the control unit, via the control output, to open or close the circuit breaker includes a control message according to IEC 61850.

15. The measuring device according to claim 14, the control unit being configured
  to receive a signal from an auxiliary contact of the circuit breaker, which signal indicates a progress of the opening or closing of the circuit breaker, and
  to determine the time-based switching behaviour of the circuit breaker in dependence on the measurement signal and the signal from the auxiliary contact.

16. The measuring device according to claim 15, the control unit being configured to receive the signal from the auxiliary contact of the circuit breaker by a message according to IEC 61850.

* * * * *

UNITED STATES PATENT AND TRADEMARK OFFICE
CERTIFICATE OF CORRECTION

PATENT NO.         : 9,140,756 B2
APPLICATION NO.    : 13/865471
DATED              : September 22, 2015
INVENTOR(S)        : Klapper Page 1 of 1

It is certified that error appears in the above-identified patent and that said Letters Patent is hereby corrected as shown below:

In the specification

Column 2
Line 15, change "claim 12" to --claim 14--

Column 4
Line 35, change "and are" to --are--

Column 6
Line 38, change "measuring unit 14" to --measuring unit 13--

Signed and Sealed this
Fifteenth Day of March, 2016

Michelle K. Lee
*Director of the United States Patent and Trademark Office*